United States Patent [19]
Kajigaya et al.

[11] Patent Number: 4,893,277
[45] Date of Patent: * Jan. 9, 1990

[54] SEMICONDUCTOR MEMORY

[75] Inventors: Kazuhiko Kajigaya; Katsuyuki Sato, both of Gakuennishi, Japan

[73] Assignee: Hitachi, Ltd., Tokyo, Japan

[*] Notice: The portion of the term of this patent subsequent to Oct. 25, 2005 has been disclaimed.

[21] Appl. No.: 255,314

[22] Filed: Oct. 11, 1988

Related U.S. Application Data

[62] Division of Ser. No. 878,072, Jun. 24, 1986, Pat. No. 4,780,852.

[30] Foreign Application Priority Data

Jun. 26, 1985 [JP] Japan ................ 60-137733

[51] Int. Cl.$^4$ ................ G11C 7/00
[52] U.S. Cl. .................. 365/203; 365/205
[58] Field of Search ........ 365/149, 203, 205, 208, 365/210

[56] References Cited

U.S. PATENT DOCUMENTS

| | | | |
|---|---|---|---|
| 4,112,508 | 9/1978 | Itoh | 365/203 X |
| 4,368,529 | 1/1983 | Furuyama | 365/205 |
| 4,601,017 | 7/1986 | Mochizuki et al. | 365/203 X |
| 4,780,852 | 10/1988 | Kajigaya et al. | 365/203 |

OTHER PUBLICATIONS

H. Kawamoto et al., "A 288 Kb CMOS Pseudo SRAM", 1984 IEEE International Solid-State Circuits Conference, Digest of Technical Papers, pp. 276-277.

*Primary Examiner*—Joseph A. Popek
*Attorney, Agent, or Firm*—Antonelli, Terry & Wands

[57] ABSTRACT

A dynamic RAM is arranged such that a common data line in each of the non-selected ones of the divided memory arrays is connected to a pair of common source lines of a sense amplifier corresponding to the memory array concerned, whereby the potential of the common data line is set at a medium level which is substantially equal to the potential of the data lines by utilizing the medium potential of the pair of common source lines and a relatively large parasitic capacity thereof, thereby maintaining the data lines at the half-precharge level. The pair of common source lines are shorted to each other during the non-select period of the memory arrays, so that the common source lines have a medium level which is substantially equal to the half-precharge level of the data lines.

20 Claims, 3 Drawing Sheets

SEMICONDUCTOR MEMORY

This is a divisional of application Ser. No. 878,072, filed June 24, 1986, now U.S. Pat. No. 4,780,852.

BACKGROUND OF THE INVENTION

The present invention relates to a semiconductor memory and, more particularly, to a technique useful for a half-precharge type dynamic RAM (random-access memory).

In a dynamic RAM having a memory capacity, e.g., 1M bits, each of the memory cells has a relatively small size, and an exceedingly large number of memory cells are connected to each of the data lines. In accordance with these circumstances, the relationship between the capacity Cs of the storage capacitor of each memory cell and the floating capacity (data line capacity) Co of each data line, i.e., the ratio Cs/Co, becomes an exceeding small value. In consequence, a data signal applied to the data line from a memory cell, that is, a potential change applied to the data line in accordance with the amount of charge stored in the capacitor Cs, undesirably becomes an exceedingly minute value.

To overcome this problem, a dynamic RAM having the following arrangement is proposed in U.S. patent application Ser. No. 380,409, filed May 20, 1982, Ito et al. According to this technique, in order to ensure a desired read level from each memory cell, each data line is divided into a multiplicity of portions, that is, a memory array is divided into a multiplicity of regions in the direction of the data lines, thereby reducing the number of memory cells connected to each data line in each of the divided memory array regions and thus maintaining the ratio Cs/Co at a desired value.

SUMMARY OF THE INVENTION

The present inventors have examined the following techniques for the purpose of increasing the scale of integration of a dynamic RAM of the type in which each data line is divided, of simplifying the arrangement of such RAM, and of lowering the power consumption thereof. First, to increase the scale of integration, a common data line selecting signal line is employed, that is, a select signal for data lines in each of the divided memory arrays is formed by a single column address decoder. To simplify the arrangement of the memory arrays and lower the power consumption, the half-precharge method (dummy-cellless method) is adopted. The half-precharge method is mentioned in ISSCC (IEEE International Solid-State Circuits Conference) 84 DIGEST OF TECHNICAL PAPERS, p. 276 to p. 277. For lowering the power consumption, a sense amplifier in the one of the divided memory arrays in which a memory cell to be selected is present is operated alone.

The present inventors have found that the following problems arise when the above-described techniques are adopted. When a select signal for selecting one of the data lines in a plurality of divided memory arrays is formed by a common column address decoder, one data line in each of the non-selected memory arrays is undesirably connected to the common data line. The data line holds the above-described half-precharge level, whereas the common data line has a potential higher than the potential of the data line. Since the data line has a relatively small capacity Co as a result of the division of it, the potential of the data line is greatly fluctuated by the connection with the common data line. In consequence, during the read operation from the selected memory cell connected to the data line at the subsequent timing, level imbalance may occur between the pair of data lines, or the operating point of the associated sense amplifier is biased to a low-sensitivity region, resulting in an erroneous read operation.

Accordingly, it is an object of the present invention to provide a semiconductor memory so designed that the scale of integration is increased, and the operation is stabilized.

It is another object of the present invention to provide a dynamic RAM so designed that the scale of integration is increased, while the power consumption is lowered, and yet the operation is stabilized.

The above and other objects, novel features and advantages of the present invention will become clear from the following description of the preferred embodiment thereof, taken in conjunction with the accompanying drawings.

A brief summary of a representative embodiment of the novel techniques disclosed in this application is as follows. Each of the common data lines in the nonselected ones in the divided memory arrays and a pair of common source lines of the associated sense amplifier are connected together. The pair of common source lines are shorted to each other during a nonselect period, so that they have a medium level which is substantially the same as the half-precharge level of the data lines. Making use of the medium potential of the common source lines and a relatively large parasitic capacity thereof, the potential of the common data line is set at a medium level which is substantially the same as that of the data lines, whereby the data lines are maintained at the half-precharge level.

DESCRIPTION OF THE PREFERRED EMBODIMENTS

Figure 1:
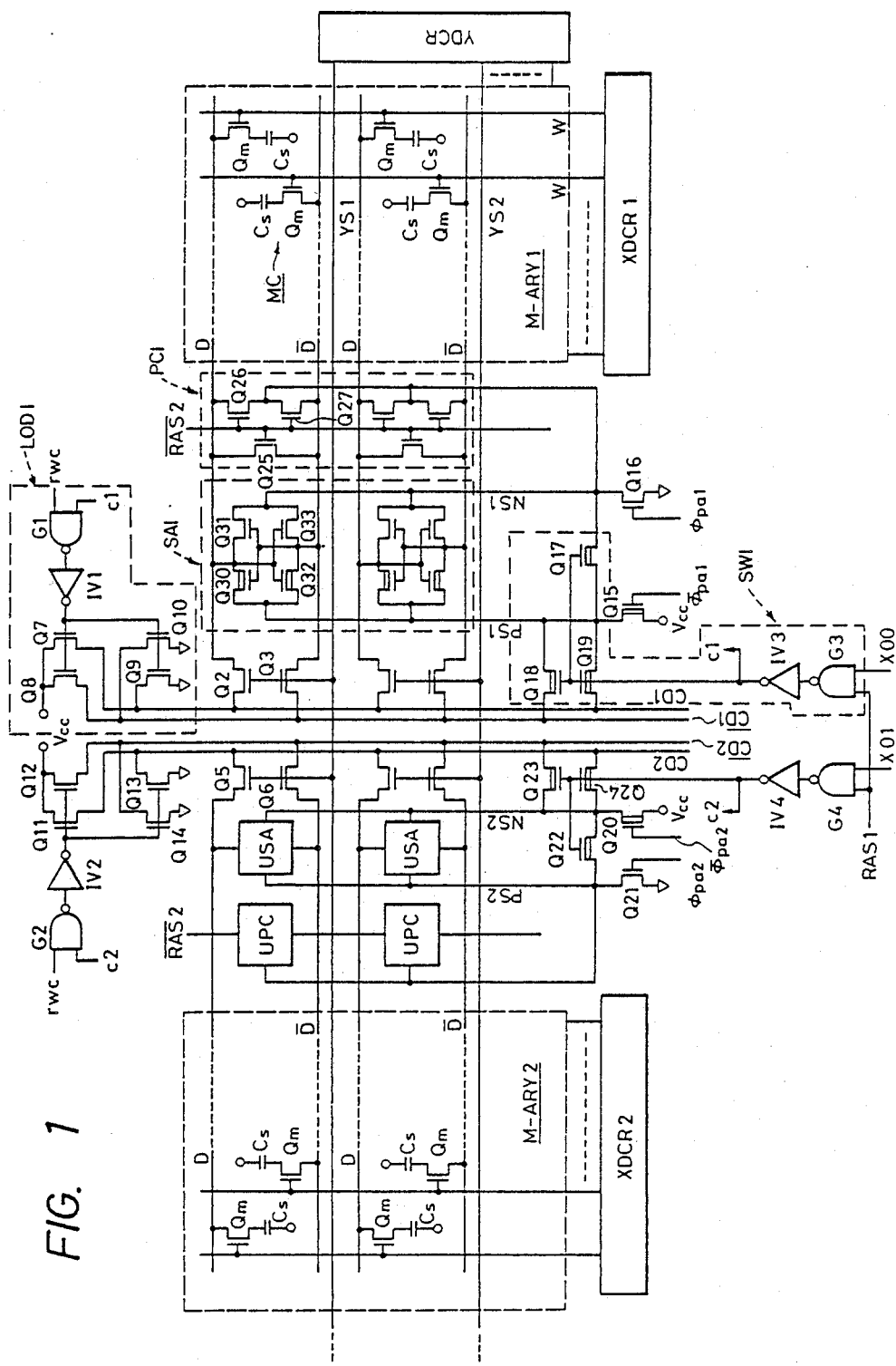
FIG. 1 is a circuit diagram of an essential part of the dynamic RAM according to the present invention.
Figure 2:
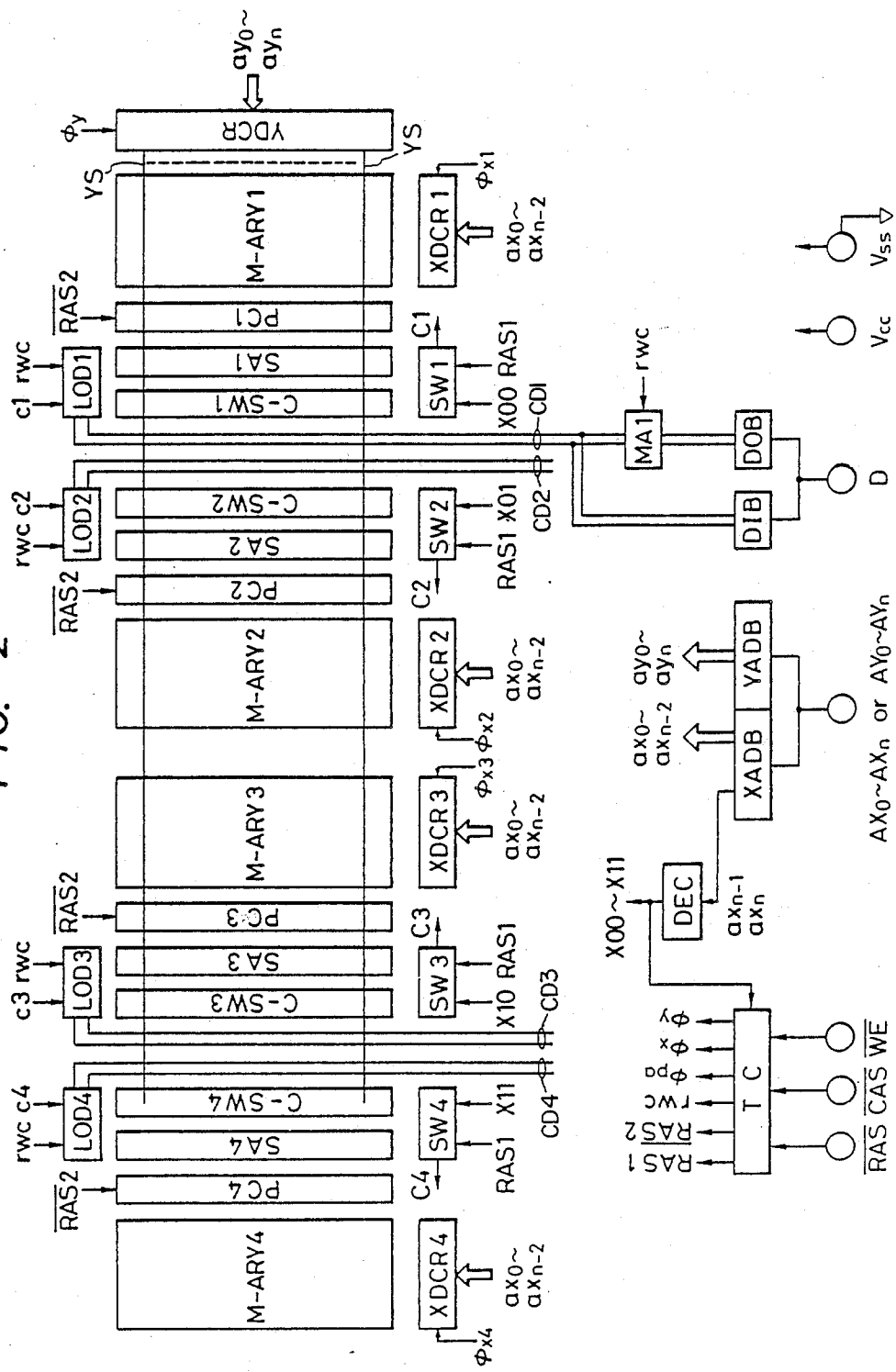
FIG. 2 is a block diagram which schematically shows the general arrangement of the dynamic RAM illustrated in FIG. 1.

FIG. 1 and FIG. 2 show one principal embodiment of the dynamic RAM according to the present invention. The circuit elements shown in FIG. 1 are formed on a semiconductor substrate, such as one which is made of a single crystal silicon, by the semiconductor integrated circuit technique, although this is not necessarily limitative.

The operations of the illustrated circuits, which constitute in combination a RAM, are respectively controlled by various timing signals generated from a timing generating circuit TC as will be clear from the explanation below.

As shown in FIG. 2, the dynamic RAM in accordance with this embodiment has four memory arrays M-ARY1 to M-ARY4, although this is not necessarily limitative. Each memory array is provided with a precharge circuit PC, a sense amplifier SA, a column switch C-SW, a pair of common data lines CD, a pull-up circuit L0D for the common data lines CD, a switching circuit SW for half-precharging the common data lines CD, and a row (X) address decoder XDCR. A numeral which is suffixed to the reference symbol representing each of the circuits denotes a memory array M-ARY corresponding to this circuit. According to the present invention, a single column (Y) address decoder YDCR is provided in common to all the four memory arrays M-ARY1 to M-ARY4.

The memory arrays and the circuit blocks respectively have the same configurations as each other. Accordingly, two memory arrays M-ARY1 and M-ARY2 and the circuit blocks provided corresponding to them are exemplarily shown in FIG. 1 as representatives, and illustration of the other memory arrays and circuit blocks is omitted. As to the precharge circuit and the sense amplifier, portions thereof which correspond to the memory array M-ARY1 alone are shown in detail. In the following description, only the memory array M-ARY1 and the circuits provided corresponding thereto will be explained.

The memory array M-ARY1 is, as shown in FIG. 1, constructed of the folded bit line (data line) system. Therefore, the memory array M-ARY1 has a plurality of pairs of data lines, i.e., a plurality of complementary data lines D, $\overline{D}$ a plurality of dynamic memory cells each connected at the input/output terminal thereof to the corresponding data line, and a plurality of word lines W to which are connected the respective select terminals of the corresponding dynamic memory cells. The memory cells are respectively disposed at the intersections between one pair of data lines D, $\overline{D}0$ and one word line W, which are exemplarily shown.

Each of the 1-bit memory cells MC is, as illustrated, constituted by a data storage capacitor Cs and an N-channel MOSFET Qm for address selection. The data which is represented by the logics "1" and "0" is stored in the form of the presence and absence of electric charge in the capacitor Cs, respectively. The data is read out in such a manner that, with the MOSFET Qm turned ON, the capacitor Cs is connected to either one of the complementary data lines, and a change in the potential of the data line in accordance with the amount of charge accumulated in the capacitor Cs is sensed.

In this embodiment, despite that the number of memory cells in the direction of data lines is increased, the number of memory cells connected to each pair of complementary data lines is made relatively small by dividing the memory array into a multiplicity of memory array regions such as the memory arrays M-ARY1 to M-ARY4. As a result, the ratio between the capacity of the capacitor Cs and the floating capacity Co (not shown) of the data line to which the capacitor Cs is connected has a desired value which enables a minute read signal corresponding thereto to be satisfactorily discriminated by the sense amplifier SA (described below).

To form a reference potential for the sensing operation of the sense amplifier SA for detecting such minute signal, the half-precharge method is utilized in this embodiment. For this purpose, a precharge circuit PC1 which is composed of N-channel MOSFETs Q25, Q26 and Q27 is provided. The MOSFET Q25 shorts the complementary data lines D, $\overline{D}0$ which are respectively brought to a high level (Vcc) and a low level (0 V) by the amplifying operation of the sense amplifier SA1 during a period in which the sense amplifier SA1 is in an inoperative state. In consequence, a precharge voltage of about Vcc/2 is given to each of the complementary data lines D, $\overline{D}$ The MOSFETs Q26 and Q27 are provided in order to prevent possible fluctuations in the half-precharge level of the complementary data lines due to, for example, a bump of the supply voltage Vcc during the amplifying operation of the sense amplifier SA1. A precharge voltage of about Vcc/2, which is obtained as a result of shorting between a pair of common source lines NS1 and PS1 (described below) which have a relatively large capacity, is supplied through the MOSFETs Q26 and Q27. In this way, the precharge level of the complementary data lines D, $\overline{D}0$ can stably be maintained at about Vcc/2. This is effective in increasing the read margin and also increasing the read speed. A row timing signal RAS2 is supplied to the respective gates of the MOSFETs Q25, Q26 and Q27, although this is not necessarily limitative.

Each of the unit circuits USA which constitute in combination the sense amplifier SA1 is defined by a CMOS latch circuit in which two CMOS inverter circuits are respectively formed from P-channel MOSFETs Q30, Q32 and N-channel MOSFETs Q31, Q33, and the respective input and output terminals of these CMOS inverter circuits are cross-coupled to each other. A pair of input and output terminals of this CMOS latch circuit are respectively connected to the corresponding complementary data lines D, $\overline{D}$ The respective sources of the P-channel MOSFETs Q30, Q32 are connected in common to those of the other unit circuits USA which are provided in the same memory array M-ARY1, thereby forming a common source line PS1. The respective sources of the N-channel MOSFETs Q31, Q33 are connected in common to those of the other unit circuits USA in the same memory array M-ARY1, thereby forming a common source line NS1.

The common source line PS1 is supplied with the supply voltage Vcc through a P-channel MOSFET Q15, while the common source line NS1 is supplied with the circuit ground potential through an N-channel MOSFET Q16. When a memory cell in the memory array M-ARY1 is selected in an operating cycle, complementary timing signals φpal and $\overline{\phi}$pal which activate the sense amplifier SA1 are applied to the respective gates of the power switch MOSFETs Q15 and Q16. In consequence, the sense amplifier SA1 effects an operation in which a minute read signal which is given to either one of the complementary data lines from the selected memory call is differentially amplified on the basis of a reference voltage which is defined by the half-precharge voltage applied to the other complementary data line. If no memory cell in the memory array M-ARY1 is selected in the memory operating cycle, the timing signals φpal and $\overline{\phi}$pal are not generated, and the MOSFETs Q15 and Q16 are consequently allowed to remain OFF. A P-channel MOSFET Q17 for shorting is provided between the pair of common source lines PS1 and NS1 of the sense amplifier SA1. When the sense amplifier SA1 is in an inoperative state, the common source lines PS1 and NS1 are shorted to each other by the operation of the P-channel MOSFET Q17, so that the potential of the common source lines PS1 and NS1 becomes about Vcc/2. As a result, the amplifying MOSFETs Q30 to Q33 and the like in the unit circuits USA can infallibly be turned OFF, and it is therefore possible to prevent the respective high and low levels of the complementary data lines D and $\overline{D}0$ before the precharging operation from being undesirably fluctuated by the change in level of the common source lines PS1 and NS1.

The row (X) address decoders XDCR1 to XDCR4 and the column (Y) address decoder YDCR are respectively supplied with internal complementary address signals ax0 to axn-2 and ay0 to ayn which are formed by address buffers XADB and YADB. The row address buffer XADB fetches external row address signals AX0 to AXn in response to the operation of the timing generating circuit TC which generates a timing signal for controlling the fetching of address signals in synchronism with the generation of a row address strobe signal $\overline{RAS}$ although this is not necessarily limitative. As a result, row internal complementary address signals ax0 to axn-2 which are to be supplied to the row address decoders XDCR1 to XDCR4 are output from the above-described address buffers. The column address buffer YADB fetches external column address signals AY0 to AYn in response to the generation of a similar timing signal in synchronism with the generation of a column address strobe signal $\overline{CAS}$, and outputs column internal complementary address signals ay0 to ayn which are to be supplied to the column address decoder YDCR. These multi-address type address buffers may be formed by utilizing address buffer circuits in accordance with well-known dynamic RAM technology.

Internal complementary address signals axn-1 and axn which respectively correspond to the two high-order bits AXn-1 and AXn in the external row address signals are supplied to a decoder DEC. The decoder DEC decodes these two-bit signals to output signals X00, X01, X10 and X11. The signals X00 to X11, which are selectively raised to the high level, are employed to select one of the four memory arrays M-ARY1 to M-ARY4 and the circuits corresponding to the selected memory array. For this purpose, the signals X00 to X11 are supplied to the timing generating circuit TC and the switching circuits SW. For example, when the signal X00 is at the high level, the memory array M-ARY1 and the circuits which correspond to this memory array are selected. The timing generating circuit TC generates signals $\phi x1$ to $\phi x4$ and $\phi pa1$ to $\phi pa4$ which correspond to the signals X00 to X11. The signals $\phi x1$ to $\phi x4$ and $\phi pa1$ to $\phi pa4$ are alternatively raised to the high level in correspondence with the signals X00 to X11.

The row address decoders XDCR1 to XDCR4 are laid out below the respective memory arrays M-ARY1 to M-ARY4 as viewed in FIG. 1. The output terminals of the row address decoders XDCR1 to XDCR4 are respectively connected to the word lines W in the corresponding memory arrays. The operations of these row address decoders XDCR1 to XDCR4 are respectively controlled by word line selecting timing signals $\phi x1$ to $\phi x4$ generated from the timing generating circuit TC, so as to output word line selecting signals in synchronism with these timing signals, respectively. In this case, one of the four row address decoders XDCR1 to XDCR4 outputs a signal for selecting one word line, and the other three row address decoders output no word line selecting signal. In other words, the three row address decoders are made inoperative by the corresponding timing signals $\phi x1$ to $\phi x4$. Accordingly, one word line in one of the memory arrays M-ARY1 to M-ARY4 is selected, while the word lines in the other three memory arrays remain non-selected. Since the row address decoders XDCR1 to XDCR4 can be formed by utilizing a known address decoder circuit, the details thereof are not illustrated; each row address decoder is constituted by a plurality of unit circuits which output signals to the word lines, respectively, in the corresponding memory arrays M-ARY1 to M-ARY4.

The operation of the column address decoder YDCR is controlled by a data line selecting timing signal output from the timing generating circuit TC or a column selection timing signal $\phi y$, so as to output a data line selecting signal or a column selecting signal in synchronism with the control timing signal. The column address decoder YDCR is laid out on the right-hand side of the memory arrays as illustrated, although this is not necessarily limitative. An exemplarily shown output line of the column address decoder YDCR, i.e., a data line select line YS1, extends over the memory arrays so as to be connected in common to the respective gates of switching MOSFETs (e.g., Q2, Q3) which constitute the respective column switches C-SW1 to C-SW4 of the memory arrays M-ARY1 to M-ARY4. Each of the data line select lines YS is provided so as to correspond to a pair of complementary data lines, although this is not necessarily limitative. Since the column address decoder YDCR can be formed by utilizing a known address decoder circuit, the details thereof are not illustrated; it is constituted by a plurality of unit circuits which respectively supply their outputs to the data line select lines. Each of the unit circuits is composed of, for example, a known CMOS static NAND gate circuit and a known CMOS inverter circuit.

Each of the unit circuits which constitute in combination the column switch C-SW1 is, as exemplarily shown, provided between a pair of common complementary data lines CD1, $\overline{CD1}$ (CD2, $\overline{CD2}$ and each pair of complementary data lines D, $\overline{D0}$ in the memory array M-ARY1 (M-ARY2). Each unit circuit is composed of N-channel switching MOSFETs Q2, Q3 (Q5, Q6) which are supplied with a common data line select signal formed by the column address decoder YDCR.

In accordance with this embodiment, the respective column switches C-SW1 to C-SW4 of a total of four memory arrays M-ARY1 to M-ARY4 are supplied with the output signal from the common column address decoder YDCR, whereby it is possible to simplify the circuit configuration.

In accordance with this embodiment, on the other hand, the operations of the row address decoders XDCR1 to XDCR4 and the corresponding sense amplifiers SA1 to SA4 for the memory arrays M-ARY1 to M-ARY4 are selectively effected in response to the signals $\phi x1$ to $\phi x4$ and $\phi pa1$ to $\phi pa4$ generated in correspondence with the row address signals axn-1, axn. Therefore, the timing generating circuit TC is adapted to receive some bits axn-1, axn in the row internal complementary address signals output from the address buffers and to selectively generate the timing signals $\phi x1$ to $\phi x4$ and $\phi pa1$ to $\phi pa4$ (high level) required for the operations of the above-described circuits on the basis of the input internal complementary address signals.

In this embodiment, only a word line in a memory array which includes a memory cell to be selected is brought into a select condition in the memory access state, and only the sense amplifier corresponding to that memory array is made operative. In consequence, any unnecessary word line selecting operation and sense amplifier operation in the remaining memory arrays are not conducted to lower the power consumption. However, the employment of the common column address decoder YDCR involves the following problem. When the selected data line in the selected memory array is connected to the corresponding common data line, the complementary data lines in the remaining, non-selected, memory arrays are undesirably connected to the corresponding common data lines at the same time. There are cases where the potential of the common data lines corresponding to the non-selected memory arrays is different from the half-precharge potential of the complementary data lines as a result of, for example, the read or write operation in the previous cycle, or a bump of the supply voltage. In such cases, the half-precharge potential of the data lines in the memory arrays is disadvantageously raised by the operation of the column switches.

Accordingly, in this embodiment, the potential of the common data lines CD, $\overline{CD0}$ in each of the non-selected memory arrays are made substantially equal to the half-precharge level by utilizing the floating capacity and holding potential, which are set at relatively large values, of the common source lines PS and NS of the sense amplifiers. For this purpose, a switching circuit SW1 is provided which is composed of P-channel MOSFETs Q17 to Q19, a gate circuit G3 and an inverter circuit IV3. P-channel switch MOSFETs Q18 and Q19 are provided between the common data lines CD1, $\overline{CD10}$ and the common source lines PS1, NS1 of the corresponding sense amplifier SA1. Similar P-channel MOSFETs Q23, Q24 are provided between another pair of common data lines CD2, $\overline{CD20}$ and the common source lines PS2, NS2 of the corresponding sense amplifier SA2, which are also exemplarily shown.

The respective gates of the MOSFETs Q18, Q19 are connected in common to the gate of the P-channel MOSFET Q17 which is adapted to short the common source lines PS1 and NS1, and supplied with a select signal cl which is formed by a logic circuit composed of a CMOS NAND gate circuit G3 which receives a row timing signal RAS1 and a signal X00 for designating the memory array M-ARY1, and a CMOS inverter circuit IV3.

The respective gates of MOSFETs Q23, Q24 of a switching circuit SW2 which corresponds to the common data lines CD2, $\overline{CD20}$ are connected in common to the gate of a P-channel MOSFET Q22 which is adapted to short the common source lines PS2 and NS2, and supplied with a select signal c2 which is formed by a logic circuit composed of a NAND gate circuit G4, similar to the above, which receives the timing signal RAS1 and a signal X01 for designating the memory array M-ARY2, and a CMOS inverter circuit IV4.

Switching circuits SW3 and SW4 which respectively connect the common data lines and the common source lines corresponding to the other memory arrays M-ARY3 and M-ARY4 are also controlled by respective output signals of logic circuits similar to the above. However, the logic circuits of the switching circuits SW3 and SW4 are respectively supplied with outputs X10 and X11 (not shown) of the decoder circuit DEC which respectively designate the memory arrays M-ARY3 and M-ARY4.

In this embodiment, a pull-up circuit LOD is provided at one end of each pair of common data lines for the purpose of increasing the read speed, although this is not necessarily limitative. A pull-up circuit LOD1 which corresponds to the common data lines CD1, $\overline{CD10}$ is composed of N-channel MOSFETs Q7 to Q10, a CMOS inverter circuit IV1 and a CMOS NAND gate circuit G1. The common data lines CD1, $\overline{CD10}$ are provided with load (pull-up) MOSFETs Q7, Q8. The respective gates of the load MOSFETs Q7, Q8 are supplied with the output signal from an inverter circuit IV1 which inverts the output signal of a NAND gate circuit G1 which receives a select signal cl for the memory array M-ARY1 and a read/write control signal rwc. MOSFETs Q11, Q12 which are provided for another pair of common data lines CD2, $\overline{CD20}$ are also supplied with the output signal from a gate circuit composed of a gate circuit G2 and a CMOS inverter circuit IV2, which are similar to those described above. N-channel MOSFETs Q9, Q10 which pass a very small current are respectively provided between the common data lines CD1, $\overline{CD10}$ and the circuit ground potential point. The respective gates of the MOSFETs Q9, Q10 are connected in common to the gates of the MOSFETs Q7, Q8. Another pair of common data lines CD2, $\overline{CD20}$ are also provided with MOSFETs Q13, Q14 which are similar to the those described above.

The pull-up circuit LOD1 is adapted to raise the potential of the common data lines CD1 and $\overline{CD10}$ from the half-precharge level to a predetermined high voltage when a read operation is started in response to the rise of the signal rwc to a high level and the memory array M-ARY1 is selected in response to the rise of the signal C1 to a high level. This predetermined potential is, for example, Vcc-Vth (Vth represents the threshold voltage of the MOSFETs. 7, Q8). The potential of the common data lines CD1, $\overline{CD10}$ changes in accordance with the potential of the complementary data lines which are connected after the above-described pull up operation. The potential of the common data lines which are connected to the data lines at the high level has substantially no change. The potential of the common data lines which are connected to the data lines at the low level is dropped from the potential Vcc-Vth toward the ground potential by the operation of the sense amplifier SA1 (or the MOSFET Q31 or Q33) which is connected to the common data lines through the column switch C-SW1.

The provision of the pull-up circuit LOD1 enables column addresses alone to be changed without any change of row addresses, thereby allowing a high-speed operation (e.g., the column static operation) of reading out data stored in another memory cell MC. More specifically, the provision of the pull-up circuit LOD1 eliminates the need to precharge the common data lines CD1, $\overline{CD10}$ prior to a subsequent operation of reading out the data stored in another memory cell MC. In addition, the amplitude of the common data line CD1 or $\overline{CD10}$ is reduced or limited by the combination of the MOSFETs Q7 and Q9 or the MOSFETs Q8 and Q10. Since the column address buffer YADB and the column decoder YDCR are respectively constituted by static circuits, column addresses are continuously changed over from one to another at high speed. Since the common data lines CD1, $\overline{CD10}$ perform a kind of static operation by virtue of the provision of the pull-up circuit LOD1, data can be continuously read out at high speed.

After data has been read out, the respective potentials of the common data lines CD1, $\overline{CD10}$ are changed to a high level and a low level, respectively. This high level may be made higher than the supply voltage Vcc by a bump of the supply voltage Vcc of the pull-up circuit LOD1. However, both the common data lines CD1, $\overline{CD10}$ are, thereafter, respectively shorted to the common source lines PS1 and NS1 having a relatively large wiring capacity during the nonselect period of the memory array M-ARY1. In consequence, the above-described high-level potential is made substantially equal to the half-precharge level of the data lines. In other words, it is possible to prevent destruction of the half-precharge level of the complementary data lines due to possible noise which may be generated in the pull-up circuit LOD1.

In this embodiment, during the non-select period of the memory array M-ARY1 the MOSFETs Q26 and Q27 turn ON in response to the rise of the signal $\overline{RAS20}$ to a high level and the MOSFETs Q17 to Q19 turn ON in response to the fall of the signal C1 to a low level as a result of the shift of the signal X00 to a low level, although this is not necessarily limitative. More specifically, all the complementary data lines D, $\overline{D0}$ in the memory array M-ARY1, the common source lines PS1, NS1 and the common data lines CD1, $\overline{CD10}$ are shorted to each other. Thus, the potential of the common data lines CD1, $\overline{CD10}$ can be made substantially equal to the half-precharge level even more stably. In addition, the potential of the common data lines CD1, $\overline{CD10}$ can be made equal to the potential of all the complementary data lines D, $\overline{D0}$ in the memory array M-ARY1.

The common data lines CD1, $\overline{CD10}$ are connected to input terminals of a main amplifier MA1 and output terminals of a data input buffer DIB, although this is not necessarily limitative. The main amplifier MA1 is constituted by a CMOS circuit which is similar to that of the sense amplifier SA1, and the output signal from the main amplifier MA1 is delivered to an external terminal through a data output buffer DOB.

The operation of the data input buffer DIB is controlled by a timing signal generated from the timing generating circuit TC, so as to form a write signal corresponding to a write signal supplied thereto from an external terminal Din and supply it to the corresponding common data lines CD1, $\overline{CD1}$ The data input buffer DIB, when placed in an inoperative state, exhibits high-output impedance characteristics.

Similarly, the operations of the main amplifier MA1 and the data output buffer DOB are controlled by a timing signal generated from the timing generating circuit TC, so as to receive a signal read out from the corresponding common data lines CD1, $\overline{CD10}$ and amplify as well as deliver the signal to the external terminal Dout.

The timing generating circuit TC for controlling the operations of reading and writing data receives a row address strobe signal $\overline{RAS}$ a column address strobe signal $\overline{CAS0}$ and a write enable signal $\overline{WE0}$ which are supplied thereto from external terminals $\overline{RAS}$ $\overline{CAS0}$ and $\overline{WE}$ respectively, and forms various timing signals (e.g., RAS1, $\overline{RAS2}$ rwc, etc.) on the basis of the input signals.

The operation of this embodiment will be schematically explained below with reference to a timing chart shown in FIG. 3. It should be noted that FIG. 3 shows a timing chart related to the memory arrays M-ARY1 and M-ARY2.

Figure 3:
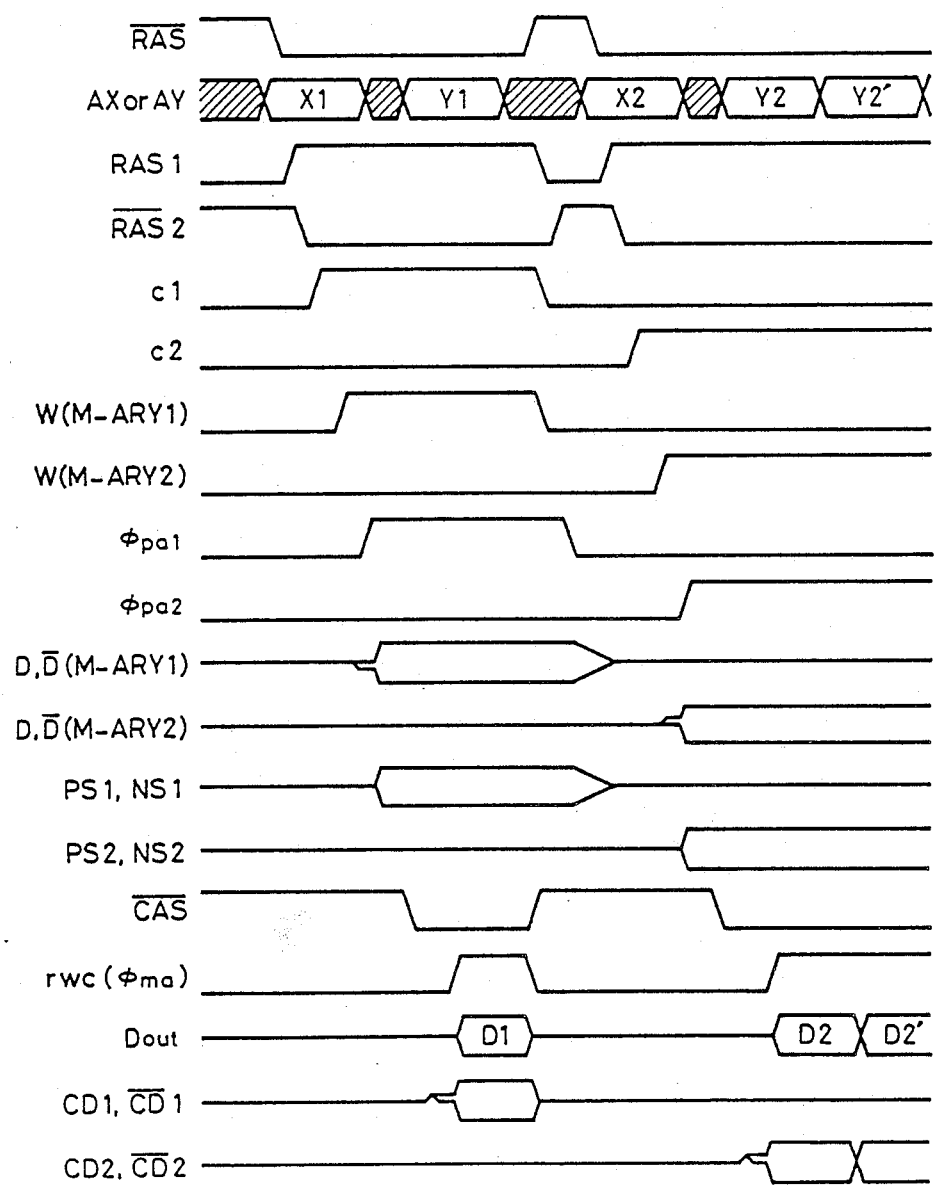
FIG. 3 is a timing chart showing one example of the operation of the dynamic RAM illustrated in FIG. 1.

In a stand-by state, the row address strobe signal $\overline{RAS0}$ and the column address strobe signal $\overline{CAS0}$ are raised to high levels, respectively, such as those shown in FIG. 3. In response to this, the timing generating circuit TC shifts the internal signals RAS1 and $\overline{RAS20}$ to a low level and a high level, respectively, and brings the various internal timings signals rwc, $\phi pa$, $\phi x$ and $\phi y$ into a reset state which is a low level. In response to the shift of the signal RAS1 to the low level, the signals c1 to c4 are shifted to a low level, and this causes the pull-up circuits LOD1 to LOD4 to be brought into an inoperative state and also causes the MOSFETs Q17 to Q19, Q22 to Q24, etc. in the switching circuits SW1 to SW4 to turn ON. In response to the shift of the signal $\phi pa$ to the low level (the shift of the signal $\phi pa$ to the high level), the MOSFETs Q15, Q16, Q20, Q21, etc. are turned OFF, and this causes the outputs of all the sense amplifiers SA1 to SA4 to be brought into a high-impedance state, so that the complementary data lines, which are connected to these sense amplifiers SA1 to SA4, are also brought into a high-impedance (floating) state. In response to the rise of the internal signal $\overline{RAS20}$ to the high level, the precharge MOSFETs Q25 and the like in the precharge circuit PC1 to PC4 are turned ON so as to short the complementary data lines D, $\overline{D0}$ which are at high and low levels, respectively, as a result of the amplifying operation of the corresponding sense amplifiers in the previous memory operating cycle, thus effecting a half-precharging operation. When the MOSFETs Q17, Q22, etc. in the switching circuits SW1 to SW4 are turned ON, the common source lines PS1, NS1 and PS2, NS2 are respectively shorted to each other. Thus, the supply voltage Vcc supplied to either one of the common source lines in the previous operating cycle and the ground potential of the other common source line are averaged to obtain a potential which is substantially equal to Vcc/2, i.e., a half voltage. When the MOSFETs Q18, Q19 and Q23, Q24, etc. in the switching circuits SW1 to SW4 are turned ON, the common source lines PS1, NS1 and PS2, NS2 and the common data lines CD1, $\overline{CD10}$ and CD2, $\overline{CD20}$ are respectively shorted to each other. Since the respective sources of a multiplicity of amplifying MOSFETs constituting the sense amplifier SA are connected in common to the common source lines PS and NS, these common source lines have a relatively large floating capacity. Accordingly, the potential of the common data lines CD1, $\overline{CD1}$ etc. which are respectively connected to the common source lines PS1 and NS1 is made coincident with the above-described half potential. In response to the rise of the signal $\overline{RAS20}$ to the high level, further, the MOSFETs Q26, Q27, etc. in the precharge circuits PC1 to PC4 are turned ON. The half voltage, which is obtained by shorting the common source lines, is also applied to the complementary data lines in the memory arrays M-ARY1 to M-ARY4. In consequence, even when the half-precharge level of the complementary data lines obtained as a result of the turning-on of the MOSFETs Q25 and the like is offset from Vcc/2, the offset level can be corrected to a potential which is substantially equal to Vcc/2.

The access to the RAM is started in response to the fall to a low level of the row address strobe signal $\overline{RAS0}$ which is practically a chip select signal. In synchronism with the fall of the signal $\overline{RAS}$ the timing generating circuit TC shifts the signals RAS1 and $\overline{RAS20}$ to a high level and a low level, respectively. In response to the shift of the precharging timing signal $\overline{RAS20}$ to the low level, the precharge circuits PC1 to PC4 are made inoperative.

The row address buffer XADB fetches as a row address signal X1 the address signals AX0 to AXn which are supplied from an external terminal in response to the rise to a high level of the timing signal RAS1 generated from the timing generating circuit TC. The internal complementary address signals axn-1 and axn which respectively correspond to the two high-order bits AXn-1 and AXn in the address signals AX0 to AXn are delivered to the decoder DEC, and the remaining internal complementary address signals ax0 to axn-2 are respectively delivered to the row address decoders XDCR1 to XDCR4. The decoder DEC, which is operated at substantially the same timing as the signal RAS1, decodes the signals axn-1 and axn and forms memory array selecting signals X00 to X11. For example, the memory array M-ARY1 is selected in response to the rise of the signal X00 to a high level. When the signals X00 and RAS1 are raised to a high level, the signal c1 alone is raised to a high level, and the MOSFETs Q17 to Q19 alone are turned OFF. Since the signals X01 to X11 are held the low level, the signals c2 to c4 are held at the low level. In response to the rise of the signal X00 to the high level, the timing generating circuit TC raises only a word line selecting timing signal $\phi$x1 (not shown) to a high level which has been brought to a reset level, that is, a low level, in advance during the stand-by period of the RAM. In response to the rise of the word line selecting timing signal $\phi$xl to the high level, the row address decoder XDCR1, which corresponds to the memory array M-ARY1 including a memory cell designated by the address signal X1, is activated to decode the above-described signal and raise one word line W to a high level so as to be brought into a selective state. At this time, in response to the fall of the signals $\phi$x2 to $\phi$x4 to the low level, the row decoders XDCR2 to XDCR4 are made inoperative. Accordingly, all the word lines in non-selected memory arrays such as the memory arrays M-ARY2 to M-ARY4 are held in the reset state of low level.

As a result of this selecting operation, either one of the complementary data lines D, $\overline{D}$0 in the memory array M-ARY1 has a minute read signal in accordance with the charge (the logic "0" in this embodiment) held in the data storage capacitor Cs in the selected memory cell MC, and the other data line maintains the half-precharge level. In consequence, a minute potential difference in accordance with the data stored in the memory cell MC is produced between the complementary data lines D, $\overline{D}$ In response to the rise of the signal c1 to a high level, the switching MOSFETs Q18, Q19 for connecting the common source lines PS1, NS1 of the sense amplifier SA1 provided for the memory array M-ARY1 to be selected and the common data lines CD1, $\overline{CD1}$ together with the switching MOSFET Q17 for shorting the common source lines PS1 and NS1, are turned OFF.

The timing signals $\phi$pal, $\overline{\phi pal}$ for activating the sense amplifier SA1 provided for the memory array M-ARY1 are shifted to a high level and a low level, respectively, after the word line W has been shifted to the select level. More specifically, the timing generating circuit TC shifts only the signal $\phi$pal to a high level (the signal $\overline{\phi pal}$ to a low level) in response to the rise of the signal X00 to the high level which takes place after an appropriate period of time has elapsed from the time of the rise of the signal $\phi$xl to the high level. The signals $\phi$pa2 to $\phi$pa4 are maintained at the low level because of the low level of the signals X01 to X11. In consequence, the power switch MOSFETs Q15 and Q16 which respectively supply operating voltages (Vcc and the circuit ground potential) to the sense amplifier SA1 are turned ON, and the amplifying operation of the sense amplifier SA1 is thereby started. The level difference, which is given between the complementary data lines in the memory array M-ARY1 from the selected memory cell MC, is eventually amplified to a level such as a high level or a low level.

After an appropriate period of time has elapsed from the time of the fall of the signal $\overline{RAS0}$ to the low level, the column address strobe signal $\overline{CAS0}$ is brought to a select level, that is, a low level. As a result, the timing generating circuit TC first generates a timing signal for the column address buffer YADB. In consequence, the address buffer YADB fetches as the column address signal Y1 address signals AY0 to AYn supplied from an external terminal and outputs internal complementary address signals ay0 to ayn corresponding to the supplied address signals. Then, a data line selecting timing signal $\phi$y (not shown) is output from the timing generating circuit TC. The column address decoder YDCR is activated in response to the data line selecting timing signal $\phi$y so as to decode the internal complementary address signals, thereby forming a data line selecting signal. When a high level signal is output from the column address decoder YDCR to, for example, the data line selecting line YS1, a pair of complementary data lines in each of the memory arrays M-ARY1 to M-ARY4 are respectively connected to the corresponding one of the pairs of common data lines CD1, $\overline{CD1}$0 to CD4, $\overline{CD4}$ In the memory arrays M-ARY2 to M-ARY4 which are in a non-selective state at this time, the potential of the common data lines CD2, $\overline{CD2}$ to CD4, $\overline{CD4}$ is made substantially equal to the half-precharge potential by the connection between the common data lines and the common source lines of the corresponding sense amplifiers which takes place in response to the fall of the signals c2 to c4 to the low level. Accordingly, even when the data lines and the common data lines in the non-selected memory arrays are connected in response to the above-described common data line selecting signal, each of the data lines maintains a potential substantially equal to the half-precharge level. Thereafter, the read/write signal rwc is generated. More specifically, if the write enable signal $\overline{WE0}$ is at a high level which represents a read operation, the timing generating circuit TC raises the signal rwc to a high level and then raises a main amplifier operation timing signal $\phi$ma to a high level a little after the rise of the signal rwc. In consequence, the signal read out to the common data lines CD1, $\overline{CD1}$0 is amplified by the main amplifier MA1, and a read signal D1 is delivered to an external terminal through the data output buffer DOB. At this time, because of the high level of the signal c1 and the rise of the control signal rwc to the high level, the pull-up MOSFETs Q7 to Q10 for the common data lines CD1, $\overline{CD1}$0 are turned ON. In other words, the pull-up circuit LOD1 is made operative. The other pull-up circuits LOD2 to LOD4 remain inoperative because of the low level of the signals c2 to c4. In consequence, the potential of the common data lines CD1, $\overline{CD1}$0 is raised from the half-precharge level to a potential Vcc-Vth and further amplified in accordance with the potential of the complementary data lines. On the other hand, when the write enable signal $\overline{WE0}$ is at a low level which represents a write operation, the timing generating circuit TC generates a timing signal for activating the data input buffer DIB. In this case, the control signal rwc is shifted to the low level, and the pull-up circuits LOD1 to LOD4 are made inoperative. The write data signal from the external terminal D is supplied to the complementary data line in the memory array M-ARY1 through the data input buffer DIB, the common data lines CD1, $\overline{CD1}$0 and the column switch C-SW1, whereby data is written into the selected memory cell MC.

When the row address strobe signal $\overline{RAS0}$ is raised to the high level, the RAM is brought into a stand-by state.

In this stand-by state, the word lines W in the selected memory array M-ARY1 are reset, and the sense amplifier SA1 is made inoperative. When the timing signal $\overline{RAS20}$ is raised to the high level thereafter, the complementary data lines D, $\overline{D0}$ which are at the high and low levels, respectively, are shorted to each other so as to have a half-precharge potential.

Then, the row address strobe signal $\overline{RAS0}$ is shifted to the low level again, and a row address signal X2 which is supplied in synchronism with the fall of the signal $\overline{RAS0}$ designates a memory cell-in, for example, the memory array M-ARY2. In consequence, one word lines W in the memory array M-ARY2 is selected, and the sense amplifier SA2 is made operative by an operation similar to the above. In response to the fall of the column address strobe signal $\overline{CAS0}$ to the low level, a column selecting operation is conducted in a manner similar to the above.

In this embodiment, at least the column decoder YDCR is constituted by a static circuit, and it is therefore possible to effect a column static operation. After a signal D2 read out from one memory cell MC designated by the address signal Y2 has been delivered to the external terminal, this signal Y2 is changed over to a column address signal Y2' without any change of the row address. In consequence, the column switches are changed over from one to another, and a signal D2' read out from a memory cell MC connected to a data line designated by the address signal Y2' is delivered to the external terminal. In order to realize such column static mode, the pull-up circuits LOD1 to LOD4 are needed. More specifically, since the previous read or write signal, which is at the low level, is brought to the high level by the pull-up circuits LOD1 to LOD4 without any precharging operation, it is possible to form a read or write signal which is opposite in phase to the previous read or write signal. Such continuous access mode enables realization of a high-speed operation of the RAM.

The present invention offers the following advantages.

(1) Since a switching circuit is provided which connects the common data lines corresponding to each of the non-selected ones among the divided memory arrays to the common source lines of the corresponding sense amplifier, the potential of the common data lines can be made substantially equal to the half-precharge level of the data lines in the memory array. Accordingly, one column address decoder can be mutually used for all the divided memory arrays, so that it is possible to increase the scale of integration.

(2) By virtue of (1), it is possible to provide a pull-up circuit for the common data lines in order to realize a high-speed continuous access such as a static column mode or a page mode.

(3) By virtue of (1), only a memory array which includes a memory cell to be selected is made operative in a memory access cycle, and the other memory arrays are not selected, whereby it is possible to lower the power consumption.

(4) By virtue of (1), a memory array can be divided into a plurality of regions in the direction of the data lines. It is therefore possible to reduce the number of memory cells connected to each of the data lines. In consequence, the floating capacity of the data lines can be decreased, and it is therefore possible to further reduce the size of each of the elements which constitute memory cells for the purpose of increasing the storage capacity. Accordingly, a dynamic RAM with an increased scale of integration and an increased storage capacity can be realized in conjunction with the advantageous effect mentioned in (1).

(5) Since the half-precharge method can be adopted by virtue of (1), it becomes unnecessary to provide any dummy cell, and this enables an increase in the scale of integration. In addition, since it is not necessary to consider deterioration of the read level margin due to imbalance between an element which constitutes each memory cell and an element which constitutes each dummy cell, the operating margin can be increased.

Although the invention accomplished by the present inventors has been described in detail by way of one embodiment, it is a matter of course that the present invention is not necessarily limited to the above-described embodiment and various changes and modifications may be imparted thereto without departing from the gist of the invention.

The arrangement may be such that a first timing signal and a second timing signal which is generated after the first timing signal are employed in place of the timing signal $\phi pa$, and a power switch MOSFET having a relatively small conductance is turned ON in response to the first timing signal so as to activate each of the unit circuits, thereby effecting an amplifying operation in a first stage, and then, a power switch having a relatively large conductance is turned ON in response to the second timing signal to effect an amplifying operation in a second stage.

The MOSFETs Q26 and Q27 in the precharge circuit may be omitted. Conversely, the MOSFET Q25 in the precharge circuit may be omitted. Alternatively, a potential Vcc/2 which is generated by an appropriate constant-voltage generating circuit may be supplied to the node between the MOSFETs Q26 and Q27. In this case also, the MOSFET Q25 may be omitted. This constant-voltage generating circuit may be adapted to supply the above-described voltage by means of a precharge MOSFET which is controlled by an appropriate constant voltage.

The circuit which supplies a precharge voltage of a substantially medium level to the common data lines in each of the memory arrays and the common source lines of each sense amplifier may also be constituted by an appropriate constant-voltage generating circuit in addition to a circuit which shorts the lines which are at a high-level potential and a low-level potential, respectively.

The number of divided memory arrays is not necessarily limited to 4. Memory arrays may be laid out on both sides of the column decoder YDCR. It is possible to provide a plurality of column decoders and divide a memory array corresponding to each of the column decoders into a plurality of memory array regions in accordance with the present invention. The layout of a column decoder and memory arrays may be variously modified.

For example, if it is necessary to reduce the refreshing cycle in the case where a memory array is divided into four, a pair of divided memory arrays (e.g., M-ARY1 and M-ARY3) and the corresponding sense amplifiers and the like may be selected. In such case, when two memory arrays (sense amplifiers) are selected in a manner similar to the above, the remaining two memory arrays (sense amplifiers) are left non-selected in a manner similar to the above. In this case, a selector circuit is added for realizing a data input/output operation carried out on a bitwise basis. For example, data is input to and output from the memory array M-ARY1 alone by the operation of the selector circuit, while the memory array M-ARY3 is refreshed by the operation of the sense amplifier.

The present invention may also be applied to a dynamic RAM of the type in which a row address signal and a column address signal are supplied from external address terminals which are independent of each other.

The present invention may be applied to any type of dynamic RAM other than those described above. Further, dynamic RAMs are not necessarily limitative, and the present invention may be widely applied to semiconductor memories. The present invention may be effectively applied to a semiconductor memory in which a memory array is divided, and a column decoder is provided in common with respect to the divided memory arrays. Even in an arrangement where data lines are not constituted by complementary data lines, or the half-precharge method is not adopted, if the arrangement involves the problem that the potential of the data lines and that of the common data lines are made different from each other, the present invention is effective in making these potentials equal to each other. The present invention is particularly effective in an arrangement adopting the half-precharge method.

We claim:

1. A semiconductor memory comprising:
    a plurality of memory arrays each including pairs of data lines, word lines intersecting said pairs of data lines, and memory cells respectively provided at the intersections between said pairs of data lines and said word lines, wherein each of said memory cells includes a MOSFET and a capacitor coupled to said MOSFET for storing data;
    precharge means for precharging said pairs of data lines to a potential which is substantially medium between first and second potentials;
    pairs of common data lines provided respectively corresponding to said memory arrays;
    first switching means for connecting each of said pairs of common data lines to each of said pairs of data lines in the memory array which said switching circuit respectively corresponds to;
    a plurality of word selecting means provided respectively corresponding to said memory arrays, wherein each of said word selecting means selects one of said word lines;
    column selecting means provided in common with respect to said memory arrays, said column selecting means including means for connecting each of said pairs of common data lines respectively to one pair of data lines selected from among said pairs of data lines in each of said memory arrays by means of said switching means on the basis of a common column selecting signal;
    memory array selecting means for selecting one of said plurality of memory arrays so that a memory cell is selected by the respective operation of said column selecting means, said plurality of word selecting means, and said memory array selecting means; and
    voltage supply means for supplying a potential having a substantially identical potential to said medium potential to a pair of common data lines corresponding to a memory array which is not selected by said memory array selecting means when said memory array selecting means selects one of said memory arrays.

2. A semiconductor memory according to claim 1, further comprising:
    a plurality of sense amplifiers, wherein each of said sense amplifiers corresponds respectively to a predetermined pair of data lines, said sense amplifiers including means for amplifying a level difference between a reference potential corresponding to said medium potential precharged on one of said pair of said data lines and a data potential applied to another one of said pair of data lines when data is read out from the selected memory cell; and
    first and second common potential lines for supplying each of said sense amplifiers with said first and second potentials for the operation thereof, said first and second common potential lines being provided corresponding to each of said memory arrays and connected in common to the sense amplifiers corresponding to each memory array.

3. A semiconductor memory according to claim 2, wherein said first and second potentials are a supply voltage and a ground potential, respectively.

4. A semiconductor memory according to claim 2, further comprising:
    shorting means for shorting said first and second common potential lines corresponding to each of said memory arrays during the non-select period of said memory arrays, thereby forming said medium potential which is to be supplied to said pairs of common data lines.

5. A semiconductor memory according to claim 4, wherein said voltage supply means is constituted by second switching means provided between said pairs of common data lines and either said first or second common potential line, said second switching means being adapted to connect together said pairs of common data lines and either said first or second common potential line when said first and second common potential lines are shorted.

6. A semiconductor memory according to claim 4, wherein said precharge means includes means for supplying said pairs of data lines with said medium potential obtained as a result of the shorting between said first and second common potential lines.

7. A semiconductor memory according to claim 4, wherein each of said sense amplifiers is constituted by two CMOS inverters which are cross-coupled to each other, said first and second common potential lines being respectively connected to the sources of P-channel MOSFETs and the sources of N-channel MOSFETs in these CMOS inverter circuits.

8. A semiconductor memory according to claim 4, further comprising:
    static pull-up means connected to each of said pairs of common data lines.

9. A semiconductor memory comprising:
    pairs of data lines;
    word lines intersecting said pairs of data lines;
    memory cells for storing data which are respectively provided at the intersections between said data lines and said word lines, wherein each of said memory cells includes a MOSFET and a capacitor coupled to said MOSFET for storing said data;
    selecting means for selecting a predetermined one of said memory cells;
    sense amplifiers each respectively coupled to a corresponding pair of data lines, wherein each of said sense amplifiers amplifies a level difference between a predetermined reference potential applied to one of said pair of data lines and a data potential applied to another one of said pair of data lines when data is read out from a selected memory cell;
a common potential line for supplying each of said sense amplifiers with a potential for the operation thereof;
switching means connected between said pairs of data lines and said common potential line, said switching means including means for coupling said common potential line to said pairs of data lines during a non-select period of time when memory cells connected to said pairs of data lines are not selected by said selecting means to provide said pairs of data lines with a potential level corresponding to a potential of said common potential line during said non-select period; and
reference potential generating means for providing said reference potential to said common potential line during said non-select period.

10. A semiconductor memory according to claim 9, wherein said common potential line is comprised of first and second common potential lines for supplying said sense amplifier with a supply voltage and a ground potential, respectively, the potential of said common potential line during the non-select period of said memory cells being made medium between said supply voltage and said ground voltage as a result of shorting between said first and second common potential lines.

11. A semiconductor memory comprising:
a plurality of memory arrays each of which includes a plurality of first data lines, a plurality of first word lines intersecting said data lines, memory cells respectively provided at the intersections between said first data lines and said word lines, a plurality of second data lines, a plurality of second word lines intersecting said second data lines and memory cells respectively provided at the intersections between said second data lines and said second word lines, wherein each of said memory cells includes a MOSFET and a capacitor coupled to said MOSFET for storing data;
precharge means coupled to said first and second data lines and for precharging said first and second data lines to a reference potential whose level is a predetermined intermediate potential level between first and second potentials;
first common data lines provided respectively corresponding to said memory arrays;
second common data lines provided respectively corresponding to said memory arrays;
a plurality of word selecting means provided respectively corresponding to said memory arrays, wherein each of said word selecting means selects a word line from said first word lines and said second word lines;
column selecting means provided in common with respect to said memory arrays, said column selecting means including means for generating a common column selecting signal for designating a first data line and a second data line from said first data lines and said second data lines in each of said memory arrays;
a plurality of column switching means provided respectively corresponding to said memory arrays, each of said column switching means being responsive to said common column selecting signal and including means for electrically coupling the first and second data lines designated in the corresponding memory array to the corresponding first and second common data lines, respectively;
memory array selecting means for selecting one of said memory arrays so that a memory cell is selected by the respective operation of said column selecting means, said plurality of word selecting means, and said memory array selecting means;
a plurality of sense amplifiers each of which is coupled to one of said first data lines and to one of said second data lines, wherein each of said sense amplifiers amplifies a level difference between said reference potential on one data line of the first and second data lines and an information potential on the other data line of said first and second data lines, wherein said information potential occurs on said other data line by the selection of the memory cell coupled to said other data line; and
voltage supply means for supplying a potential having a substantially identical potential to said reference potential to first and second common data lines corresponding to a memory array which is not selected by said memory array selecting means when said memory array selecting means selects one of said memory arrays.

12. A semiconductor memory according to claim 11, wherein the level difference between said first and second potentials corresponds to the level difference obtained by the operation of the sense amplifier on the first and second data lines.

13. A semiconductor memory according to claim 12, wherein said voltage supply means includes means for supplying a third potential having a predetermined level between said first potential and said reference potential.

14. A semiconductor memory according to claim 13, wherein said first and second potentials are a supply voltage and a ground potential, respectively.

15. A semiconductor memory according to claim 14, wherein each of said first data lines and each of said second data lines are a pair.

16. A semiconductor memory according to claim 15, wherein each of said first data lines and each of said second data lines are a pair.

17. A semiconductor memory according to claim 16, further comprising a first power line for receiving said power voltage and a second power line for receiving said ground potential, wherein each of said sense amplifiers includes a first CMOS inverter circuit coupled between said first and second power lines and a second CMOS inverter circuit coupled between said first and second power lines.

18. A semiconductor memory according to claim 17, further comprising:
static pull-up means connected to each of said first and second common data lines.

19. A semiconductor memory according to claim 13, wherein said precharge means includes reference potential generating means for generating said reference potential and switching means for supplying said reference potential to the first and second common data lines which correspond to the non-selected memory array when said memory array selecting means selects one of said memory arrays.

20. A semiconductor memory according to claim 19, wherein said reference potential generating means includes a plurality of reference potential generators provided respectively corresponding to said memory arrays, wherein each of said reference potential generators generates said reference potential when the corresponding memory array is not selected by said memory array selecting means.

* * * * *